US005479320A

United States Patent [19]

Estes et al.

[11] Patent Number: 5,479,320

[45] Date of Patent: Dec. 26, 1995

[54] BOARD-TO-BOARD CONNECTOR INCLUDING AN INSULATIVE SPACER HAVING A CONDUCTING SURFACE AND U-SHAPED CONTACTS

[75] Inventors: H. Scott Estes, Austin; James J. Ganthier, Spring, both of Tex.

[73] Assignee: Compaq Computer Corporation, Houston, Tex.

[21] Appl. No.: 139,605

[22] Filed: Oct. 20, 1993

Related U.S. Application Data

[63] Continuation of Ser. No. 815,399, Dec. 31, 1991, abandoned.

[51] Int. Cl.$^{6}$ .............................. H01R 23/68; H01R 9/09; H05K 1/11

[52] U.S. Cl. .......................... 361/785; 361/744; 361/785; 361/790; 361/804; 361/803; 439/43; 439/66; 439/71; 439/91; 439/96

[58] Field of Search ............................ 174/138 E, 138 G, 174/146, 166 S; 361/758, 784, 785, 787, 789, 790, 791, 804, 744, 788, 735, 742; 439/43, 66, 71, 91, 96

[56] References Cited

U.S. PATENT DOCUMENTS

| | | | |
|---|---|---|---|
| 3,147,402 | 9/1964 | Hochstetler | 361/412 |
| 3,173,732 | 3/1965 | James | 361/413 |
| 3,382,414 | 5/1968 | Borner | 361/785 |
| 3,447,040 | 5/1969 | Denton, Jr. | 439/66 |
| 3,546,775 | 12/1970 | Lalmond et al. | 29/625 |
| 3,551,750 | 12/1970 | Sterling | 439/66 |
| 3,593,064 | 7/1971 | Wagner et al. | 361/784 |
| 3,727,168 | 4/1973 | Henschen et al. | 439/498 |
| 3,735,206 | 5/1973 | Pesek | 361/784 |
| 3,795,884 | 3/1974 | Kotaka | 439/66 |
| 3,924,915 | 12/1975 | Conrad | 361/413 |
| 3,960,424 | 6/1976 | Weissenburger | 439/66 |
| 3,998,512 | 12/1976 | Anhalt et al. | 439/66 |
| 4,057,311 | 11/1977 | Evans | 439/66 |
| 4,203,203 | 5/1980 | Gilissen et al. | 439/77 |
| 4,295,700 | 10/1981 | Sado | 361/413 |
| 4,402,562 | 9/1983 | Sado | 439/66 |
| 4,511,196 | 4/1985 | Schuler et al. | 439/96 |
| 4,575,780 | 3/1986 | Brombal et al. | 361/413 |
| 4,689,721 | 8/1987 | Damerow et al. | 361/785 |
| 4,757,780 | 7/1988 | Spigarelli et al. | 118/64 |
| 4,927,369 | 5/1990 | Grabbe et al. | 439/66 |
| 4,983,126 | 1/1991 | Busse et al. | 439/66 |
| 4,998,886 | 3/1991 | Werner | 439/66 |
| 5,088,929 | 2/1992 | Enomoto | 439/66 |

FOREIGN PATENT DOCUMENTS

| | | | |
|---|---|---|---|
| 0182700 | 5/1986 | European Pat. Off. | 439/66 |
| 0359223 | 3/1990 | European Pat. Off. | 439/66 |
| 2626136 | 7/1989 | France | 439/66 |
| 2234961 | 4/1973 | Germany | 439/66 |
| 2604787 | 8/1976 | Germany | 439/71 |
| 2610826 | 9/1977 | Germany | 439/66 |
| 1-183887 | 7/1989 | Japan | 428/901 |
| 1-208892 | 8/1989 | Japan | 439/66 |
| 2-144869 | 6/1990 | Japan | 439/66 |
| 87/06091 | 10/1987 | WIPO | 439/67 |

OTHER PUBLICATIONS

SP America, Inc. "With Shin-Etsu's New Connector, Any Connection is Possible" pub. 1985.

*Primary Examiner*—Donald A. Sparks
*Attorney, Agent, or Firm*—Synnestvedt & Lechner

[57] ABSTRACT

A printed circuit board modular assembly is disclosed. The disclosed invention comprises a first printed circuit board having an electronic terminal portion for providing electrical connection to the first printed circuit board; a second printed circuit board having an electrical terminal portion for providing electrical connection to the second printed circuit board; a spacing member disposed between the first and second printed circuit boards; and electrical signal transmission contacts situated on the spacing member for providing electrical connection between the first printed circuit board and the second printed circuit board.

8 Claims, 3 Drawing Sheets

BOARD-TO-BOARD CONNECTOR INCLUDING AN INSULATIVE SPACER HAVING A CONDUCTING SURFACE AND U-SHAPED CONTACTS

This is a Continuation of U.S. application Ser. No. 07/815,399, filed Dec. 31, 1991 now abandoned.

1. Field of the Invention

The present invention is directed to the field of electrical connectors and contacts. In particular, the present invention is directed to the field of connectors for mating electronic printed circuit boards.

2. Background of the Invention

In electronic systems such as avionics and computer systems, electronic modules are typically packaged on printed circuit board (PCB). A combination of two or more PCBs form a PCB module. PCB modules typically have edge connectors for connecting into larger boards known as back planes or mother boards. PCB modules are further typically oriented in a parallel configuration with respect to each other. In conventional forms of this arrangement, the PCB modules are assembled in pairs, each forming a dual PCB module with a single connector at one edge of the module.

A difficulty with many prior art PCB modules has resulted from the requirement for connections between the boards, as well as from the boards to the back plane. In part, this requirement arises from the limited back plane capacity available to handle input and output signals to and from the boards. It is therefore typical for some of the signals to be routed from one board to another prior to reaching the mother board. In the prior art, these intramodule connections have typically been established by means of a special connector assembly or a flexible printed-circuit connector located at the top edge of the boards opposite the bottom.

One prior art system directed toward providing PCB connection has incorporated PCBs joined by a flexible connector and including a multi-pin connector for attachment to a back plane. U.S. Pat. No. 4,689,721 discloses a dual printed circuit board module having two printed circuit boards mounted in an inwardly facing relationship on two thermal frame members. The frame members function as structural and enclosing members. A connector mounted between and at one edge of the thermal frame member serves to establish electrical connections between the circuit boards and a back plane circuit panel to which the boards are connected. A flexible interconnect circuit, located near the same edge of the boards, is used both to connect the boards to the connector and to provide board connections. The flexible connector expands as the top board pivots open.

The device disclosed in U.S. Pat. No. 4,689,721 thus utilizes numerous components, and requires the use of a complex multi-pin connection mechanism for connection to the back plane. The connecting mechanism disclosed in U.S. Pat. No. 4,689,721 further does not facilitate easy connection to more than two boards and utilizes a flexible connector which may be torn or pulled apart when the boards are disassembled.

There has been a long felt need for PCB board connector mechanisms and systems for joining two or more PCB boards and which provide a multiplicity of contact points and which can also be easily fabricated and attached to the boards. There has also been a long felt need for PCB board-to-board connectors which facilitate easy board-to-board connection and disassembly.

OBJECTS AND SUMMARY OF THE INVENTION

It is therefore a principal object of the present invention to provide board-to-board contact and connector devices for easily disassembling connecting at least two printed circuit boards.

It is further object of the present invention to provide a board contact and connector mechanism which can be utilized to connect at least two PCBs and which can be used to connect one or more PCBs to a third PCB board such as a mother board.

In view of the above objects and in accordance with the present invention, a board-to-board connector mechanism and system is disclosed. The mechanism preferably comprises a first printed circuit board having an electrical terminal portion for providing electrical connection to the first printed circuit board; a second printed circuit board having an electrical terminal portion for providing electrical connection to the second printed circuit board; a spacing member disposed between the first and second printed circuit boards; and electrical signal transmission means on the spacing member for providing electrical connection between the first printed circuit board and the second printed circuit board.

In accordance with a second preferred embodiment of the present invention, a printed circuit board modular assembly is disclosed. The invention comprises a first printed circuit board having a printed circuit board retaining aperture therein; a second printed circuit board having a printed circuit board retaining aperture therein; a connecting member disposed between the first and second printed circuit boards, the connecting member comprising an insulating spacer having mounting apertures therein; retaining means for mechanically connecting said first printed circuit board to said second printed circuit board and for fixedly maintaining said spacer between said first and second printed circuit boards, the retaining means comprising: a retaining pin passing through each of said retaining apertures in the printed circuit board and the mounting aperture in the insulating spacer; first means on a first end of the retaining pin for preventing the first end of the retaining pin from moving through the retaining aperture in the first printed circuit board; and second means on a second end of the retaining pin for preventing said second end of said retaining pin from moving through said aperture in said second printed circuit board; and electrical signal transmission means on said spacer means for providing electrical connection between said first printed circuit board and said second printed circuit, said electrical signal transmission means comprising a conductive lead having a first portion in contact with said first printed circuit board and a second portion in contact with said second printed circuit board.

The present invention is further specifically directed to an apparatus for electrically connecting a printed circuit board modular assembly having first and second circuit boards. The apparatus comprises a connecting member disposed between said first and second printed circuit boards; said connecting member comprising an insulating spacer having mounting apertures therein for mounting said connecting member between said printed circuit boards; and electrical signal transmission means on said spacing member for providing electrical connection between said first printed circuit board and said second printed circuit board, said electrical signal transmission means comprising a resilient U-shaped contact extending through the spacer member such that a first sidewall of the resilient U-shaped contact physically contacts the first board and the second sidewall of the resilient U-shaped contact physically contacts the second board.

DETAILED DESCRIPTION OF THE PREFERRED EMBODIMENT

Figure 1:
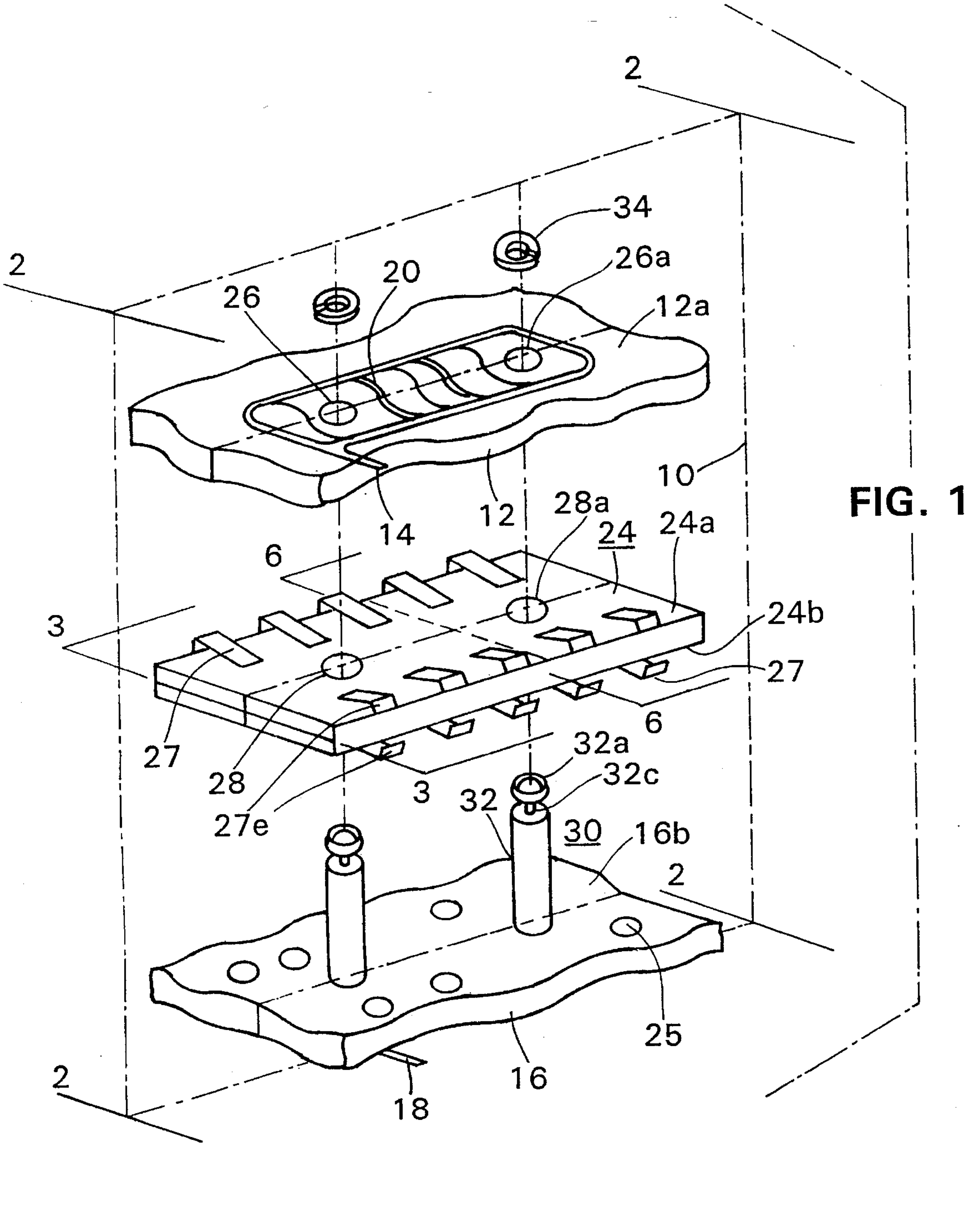
FIG. 1 is an exploded view of the separator and contact connector of the present invention with metallic connectors.

The present invention is disclosed with reference to the enclosed figures. Referring to FIG. 1, the PCB board-to-board contact mechanism 10 of the present invention is shown in an exploded view. The mechanism, in a preferred embodiment, is utilized to electronically connect two PCBs, and comprises a first printed circuit board 12 having an electrical terminal portion 14 for providing electrical connection to the first printed circuit board 12. The system further comprises a second printed circuit board 16 having an electrical terminal portion 18 for providing electrical connection to the second printed circuit board 16.

The outward surfaces 12*a* of the first printed circuit board 12 and the outward surfaces (not shown) of the second printed circuit board 16 contain a plurality of metallic etchings 20 which provide leads and define electronic circuits imprinted on the respective boards. Referring to the lower portion of FIG. 1 and FIG. 2, the imprinted electronic leads contain metallic contacts 22 at various points which extend through the respective boards 12, 16 and form metallic contact points 25 on the inward surfaces 12*b*, 16*b* of the boards. The boards 12 and 16 preferably contain retaining apertures 26, 26*a* for permitting the connection of the boards 12, 16 to a spacer member 24 by means of retaining means 30, both to be discussed below.

Figure 6:
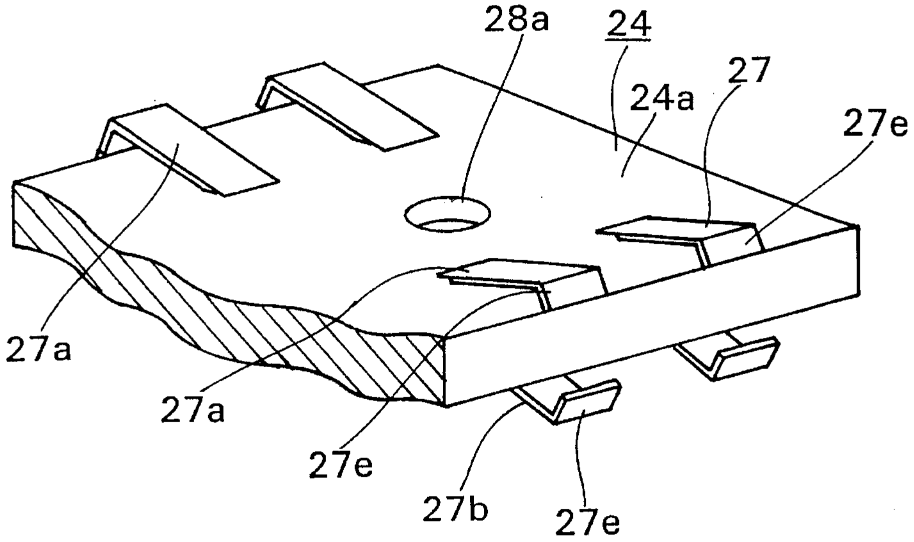
FIG. 6 is an enlarged perspective view of the spacer member and contacts of the present invention.

Referring to FIGS. 1 and 6, a key component of the PCB board-to-board contact mechanism of the present invention is the inclusion of a spacer member 24 disposed between the first and second printed circuit boards 12, 16. In a preferred embodiment, the spacer member 24 may comprise a block constructed from an insulative material such as a polymer which separates the boards 12, 16. The spacer member 24 has major surfaces 24*a*, 24*b*. The spacer member 24 preferably includes mounting apertures 28, 28*a* which align with the apertures 26, 26*a* on the boards. While the spacer member 24 disclosed in the figures is shown to be rectangular, it is to be appreciated that the spacer member 26 may assume a number of shapes, configurations and widths consistent with the particular needs and application.

The preferred embodiment further includes electrical signal transmission means 27 situated on the spacer member 24 for providing an electrical connection between the first printed circuit board 12 and the second printed circuit board 16. In a preferred embodiment, the electrical signal transmission means includes one or more resilient metallic contacts 27 which are partially embedded in spacer member 24. In such preferred embodiments each of the contacts 27 comprises a substantially U-shaped resilient metallic contact 27 which extends through the first and second major surfaces 24*a*, 24*b* of the spacer member 24, and which provides a potential point of electrical contact between the metallic contact points 25 on the first and second boards.

Figure 2:
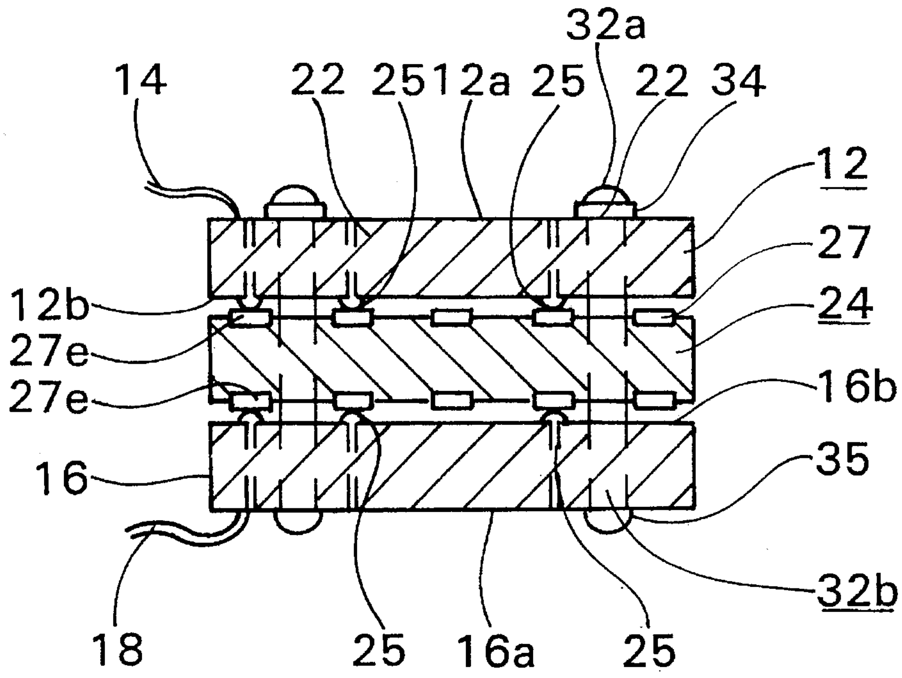
FIG. 2 is a non-exploded section view of the connector of the present invention along line 2—2 FIG. 1.
Figure 3:
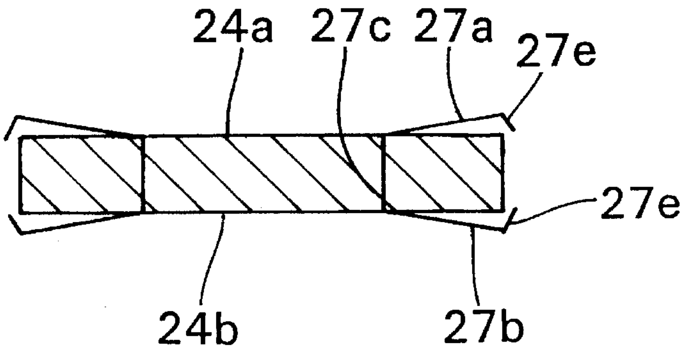
FIG. 3 is a section view along line 3—3 of FIG. 1 of the board-to-board connector of the present invention.

Referring to FIGS. 2 and 3, one side 27*a* of the U-shaped contact 27 is adapted to maintain electrical contact with the first board 12 and a second side 27*b* of the U-shaped contact 27 adapted to maintain electrical contact with the second board 16. The trough 27*c* of the U-shaped contact 27 extends through the spacer member 24. The number of the contacts 27 and respective metallic contact points 25 on the inward spacer member side of the boards can be varied as needed to achieve the desired number of electrical connections between the first and second boards. For example, FIG. 2 illustrates an embodiment in which three contacts 27 join three sets of metallic contact points 25 on the first and second boards 12, 16.

As shown most particularly in FIG. 6, the sidewalls 27*a* and 27*b* of U-shaped contacts 27 are angled slightly with respect to the spacer member 24 to impart flexibility and resiliency and so as to maintain contact against the boards. The spring-like resiliency of the contacts permits the contacts 27 and spacer member 24 to be removed and adjusted. The metallic contacts 27 create one or more electronic contact points for joining the first and second boards 12, 16.

As shown in FIGS. 1, 3, 5 and 6, the sidewalls 27*a* and 27*b* of the U-shaped contacts 27 preferably extend past the edge of the spacer member 24. In addition, in the preferred embodiment, ears 27*e* at the end of the sidewalls 27*a*, 27*b* are formed by bending the sidewalls 27*a*, 27*b* of the U-shaped contact 27.

Figure 4:
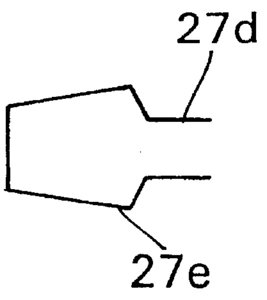
FIG. 4 is a section view of a connector which may be utilized with the board-to-board connector of the present invention.

The contacts 27 may be fabricated using conventional techniques. A large variety of fabrication methods well known to the skilled in the art may be employed to fabricate the contacts 27. For example, they may be stamped from a pre-plated material and retained on a carrier strip 27*d* as is well known and as is shown in FIG. 4. During fabrication, the contacts are compressed and placed in an insert mold. Insulation material is then injected in place, the part removed, thereby relieving compression. A plastic flash is skieved off the contact surfaces and the carrier strips 27*d* are then removed.

The PCB board-to-board contact mechanism of the present invention is preferably, although, not necessarily, utilized in conjunction with a retaining means according to the present invention. The retaining means functions to mechanically connect the first printed circuit board 12 with the second printed circuit board 16 and further to fixedly maintain the spacer member 24 between the first and second printed circuit boards 12 and 16.

Referring to FIGS. 1 and 2, the retaining means of a preferred embodiment is shown in detail. The retaining means 30 comprises a retaining pin 32 which passes through the retaining apertures 26, 26*a* in the printed circuit boards and the mounting apertures 28, 28*a* in the insulating spacer member 24. The retaining pin 32 may be cylindrical, square, or other geometric shape which conforms to the shape of the apertures 26, 28. The retaining pin 32 includes first and second ends 32*a*, 32*b*, respectively, and an annular slot 32*c* proximate to the first end 32*a*.

Means 34 on the first end 32*a* of the retaining pin 32 prevents the first end 32*a* of the retaining pin from moving through the retaining aperture 26*a* in the top of the top printed circuit board. The resilient pin 32 also includes means 35 on the second end of the retaining pin 32*b* which prevents the second end 32*b* of the retaining pin 32 from moving through the aperture in the second printed circuit board 16. In a preferred embodiment, the means 34 on the first end **32*a* comprises a locking device 34 which can be made from wire. The locking device 34 may form a ring having a compressed closure which is designed to fit within the annular slot 32*c* and provide a secure connection. It is envisioned that a large number of locking devices could be used in the present invention. The locking means should preferably be removable so as to facilitate the easy removal of the first board 12 and spacer member 24 with contacts 27. The means 35 on the second end of the retaining pin 32*b* may preferably comprise a semi-compliant solder lead with which to solder the pin to the outer surface 12*a* of the second board 16. In this manner, the boards 12, 16, spacer member 24 and contacts 27** are maintained in a rigid configuration.

Figure 5:
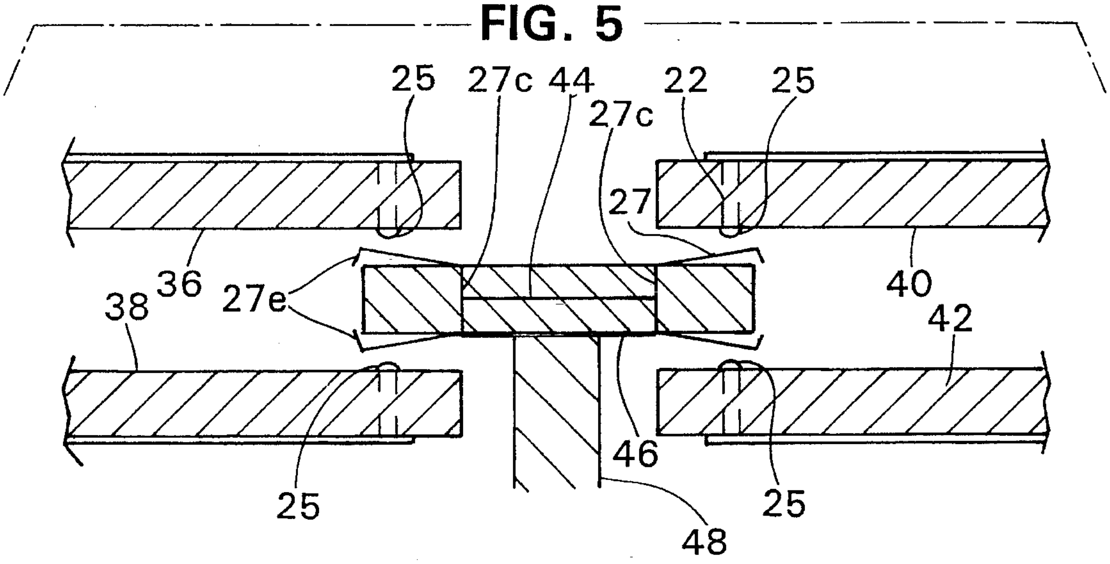
FIG. 5 is a section view of an alternative embodiment of the present invention.

FIG. 5 illustrates an alternative embodiment of the present invention in which the spacer member 24 and contacts 27 are utilized to contact boards 36, 38, 40 and 42 which may not be directly opposite to each other. In this configuration, one or more electrical conductor means 44 extends through the spacer member 24 thus linking multiple contacts 27 on a single spacer member 24 at troughs **27*c*. Thus, electrical contact is possible between contact points 25 not located directly across a single contact 27. Accordingly, a plurality of boards or contacts 27 can be accessed across a single spacer member 24**.

As shown in FIG. 5, this embodiment further includes and provides for the interconnection of a multiplicity of boards and the connection to a board which may be a mother board 48. The spacer 24 member in this configuration may include one or more external conductors 46 located on one or both of the major surfaces **24*a*, 24*b* of the spacer member 24 which permit electrical contact between boards 36, 38 and boards 40, 42. Thus, through the use of conductors 44 or external conductors 46, the metallic contact points 25 on board 24 can conduct between boards 36, 38 and boards 40, 42, and can further electrically connect with another PCB board such as a mother board 48 as shown in FIG. 5**.

The operation and use of the PCB board-to-board connector of the present invention is now described with reference to the enclosed figures. Initially, referring to FIG. 1, the first printed circuit board 16 is aligned over the retaining pins 32. The retaining pins 32 are then soldered, at their second ends **32*b*, to the bottom of the board 16. The spacer member 24 with contacts 27 is then installed via the mounting apertures 28, 28*a* over the pins 32. The spacer member 24 will include a plurality of contacts 27, so positioned to mate with the appropriate contact points 25 on the first and second boards in accordance with the particular circuit requirements of the system. The first board 14 is then placed over the pins 32 via apertures 26, 26*a* and secured with locking rings 34 or other locking means. The resilient feature of the contacts 27 facilitates electrical connection between the metallic contact points 25** on first and second boards.

In the alternative embodiment of FIG. 5, the inclusion of a conductor 44 joining two or more contacts 27, facilitates contact between boards which are not in contact with the same connector 27. The inclusion of external conductors 46 facilitates electrical contact between the boards and a third board or mother board. Hence, the present invention provides for a wide variety of contact points and design options.

The present invention has been described with reference to the enclosed figures and preferred embodiment. It is to be appreciated that other embodiments may fulfill the spirit and scope of the present invention and that the true nature and scope of the present invention should be determined with reference to the claims appended hereto.

What is claimed is:

1. Apparatus for electrically connecting a plurality of printed circuit boards, comprising:

(a) a connecting member adapted for disposal between a first of said printed circuit boards and a second of said printed circuit boards, said connecting member comprising an insulating spacer having mounting apertures therein for mounting said connecting member between said first and second printed circuit boards;

(b) electrical signal transmission means on said connecting member for providing electrical connection between said first printed circuit board and said second printed circuit board, said electrical signal transmission means comprising a U-shaped contact extending through the connecting member such that a first sidewall of the U-shaped contact is adapted to physically contact a desired terminal of the first board and a second sidewall of the U-shaped contact is adapted to physically contact a desired terminal of the second board; and (c) a conducting surface on said connecting member, said conducting surface being in contact with said electrical signal transmission means for electrically connecting said electrical signal transmission means with a third printed circuit board.

2. The apparatus for electrically connecting a plurality of printed circuit boards of claim 1 wherein the first and second sidewalls are angled at an acute angle with respect to the insulating spacer.

3. The apparatus for electrically connecting a plurality of printed circuit boards of claim 1 wherein the U-shaped contacts of the electrical signal transmission means protrude through the insulating spacer of the connecting member.

4. The apparatus of claim 3, wherein the U-shaped transmission means is embedded in the spacing member.

5. The apparatus of claim 1, wherein at least one of said sidewalls of the U-shaped contact has a length such that at least a portion of said sidewall extends beyond an edge of the insulating spacer.

6. The apparatus of claim 1, wherein both of said sidewalls of the U-shaped contact have a length such that at least a portion of each sidewall extends beyond an edge of the insulating spacer.

7. The apparatus of claim 6, wherein said portions of the sidewalls which extend beyond the edge of the insulating spacer are bent towards each other.

8. The apparatus of claim 1, wherein said first and second side walls of the U-shaped contact are resilient.

* * * * *